(12) United States Patent
Richardson et al.

(10) Patent No.: US 7,557,375 B2
(45) Date of Patent: Jul. 7, 2009

(54) METHOD FOR FABRICATING CRYSTALLINE SILICON

(75) Inventors: Christine E. Richardson, Pasadena, CA (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 165 days.

(21) Appl. No.: 10/974,390

(22) Filed: Oct. 26, 2004

(65) Prior Publication Data

US 2006/0030131 A1 Feb. 9, 2006

Related U.S. Application Data

(60) Provisional application No. 60/599,277, filed on Aug. 5, 2004.

(51) Int. Cl.
*H01L 29/00* (2006.01)

(52) U.S. Cl. .............. 257/65; 257/52; 257/75; 257/E31.043; 438/166; 438/486

(58) Field of Classification Search ............ 257/50, 257/52, 57, 58, 65, E31.043; 438/166, 482
See application file for complete search history.

(56) References Cited

U.S. PATENT DOCUMENTS

| | | | |
|---|---|---|---|
| 5,501,989 A | | 3/1996 | Takayama et al. ............ 438/155 |
| 6,084,247 A | * | 7/2000 | Yamazaki et al. ............. 257/58 |
| 6,162,667 A | | 12/2000 | Funai et al. .................. 438/166 |
| 2002/0100409 A1 | * | 8/2002 | Jang et al. ...................... 117/3 |
| 2003/0013237 A1 | * | 1/2003 | Jang et al. .................... 438/151 |
| 2003/0013278 A1 | * | 1/2003 | Jang et al. .................... 438/466 |
| 2004/0180477 A1 | * | 9/2004 | Zhang et al. ................. 438/149 |
| 2004/0211356 A1 | * | 10/2004 | Yamazaki et al. ............. 117/84 |

* cited by examiner

*Primary Examiner*—Tu-Tu V Ho
(74) *Attorney, Agent, or Firm*—DLA Piper LLP (US)

(57) ABSTRACT

The present invention provides methods of manufacturing of silicon in substantially crystalline form out of amorphous silicon.

30 Claims, 9 Drawing Sheets

METHOD FOR FABRICATING CRYSTALLINE SILICON

CROSS REFERENCE TO RELATED APPLICATIONS

This application claims the benefit of priority under 35 U.S.C. § 119(e) of U.S. Ser. No. 60/599,277 filed Aug. 5, 2004, the entire content of which is incorporated herein by reference.

BACKGROUND OF THE INVENTION

1. Field of the Invention

The present invention relates generally to the field of fabricating of silicon, more particularly, to the methods of manufacturing of silicon in substantially crystalline form out of amorphous silicon.

2. Background Information

Crystalline silicon is an important material widely used in a variety of applications. One way to prepare crystalline silicon is by the process of metal-induced crystallization of amorphous silicon to form large-grained polycrystalline silicon templates. Such silicon crystals can be used for manufacturing of various devices requiring the use of thin films. Examples of such devices include solar cells, thin film transistors, microelectromechanical (MEMs) devices and optical waveguides for various telecommunications applications. To illustrate, in the process of fabrication of solar cells, large-grained polycrystalline silicon templates can be prepared first. Epitaxial thin silicon films can then be grown on the polycrystalline silicon templates, to be used in high-efficiency solar cells and high minority lifetime silicon material, fabricated on inexpensive glass substrates.

One of methods currently used for making the crystalline silicon out of amorphous silicon includes incorporating a reactive metal into amorphous silicon, followed by annealing. The metal particles are intended to nucleate amorphous silicon and to induce the process of crystallization which can lead to the formation of silicon crystals having grain sizes as large as 100 micrometers. However, the currently used processes typically require using high annealing temperatures, or prolonged periods of annealing, or both. Thus, the process requires long times, and thus is expensive, and, due to incompatibility of low-cost substrates with high annealing temperatures, the quality of the final polycrystalline silicon can in some cases be inadequate. Accordingly, it is desirable to have a better process of making the crystalline silicon out of amorphous silicon, such as a faster process requiring lower annealing temperatures.

SUMMARY OF THE INVENTION

According to one embodiment of the present invention, a method for fabricating crystalline silicon is provided, the method including forming a layer of amorphous silicon, depositing a metal over the layer of amorphous silicon to form a metal-silicon composite, placing the metal-silicon composite in a reductive environment, and annealing the metal-silicon composite to obtain crystalline silicon thereby. An example of the reductive environment that can be used includes Si containing environment.

Examples of the metals that can be used for forming the metal-silicon composite include gold, silver, aluminum, indium, copper, nickel and palladium. The annealing temperature can be between about 150° C. and 600° C., and the duration of the annealing can be between about 30 minutes and 6 hours. The Si containing environment can be created by using a Si containing agent in gaseous form, for example, silane ($SiH_4$).

According to another embodiment of the present invention, a device including crystalline silicon is provided, where crystalline silicon is formed by annealing a composite, comprising amorphous silicon and a metal, in a reductive environment.

DETAILED DESCRIPTION OF THE INVENTION

Figure 1:
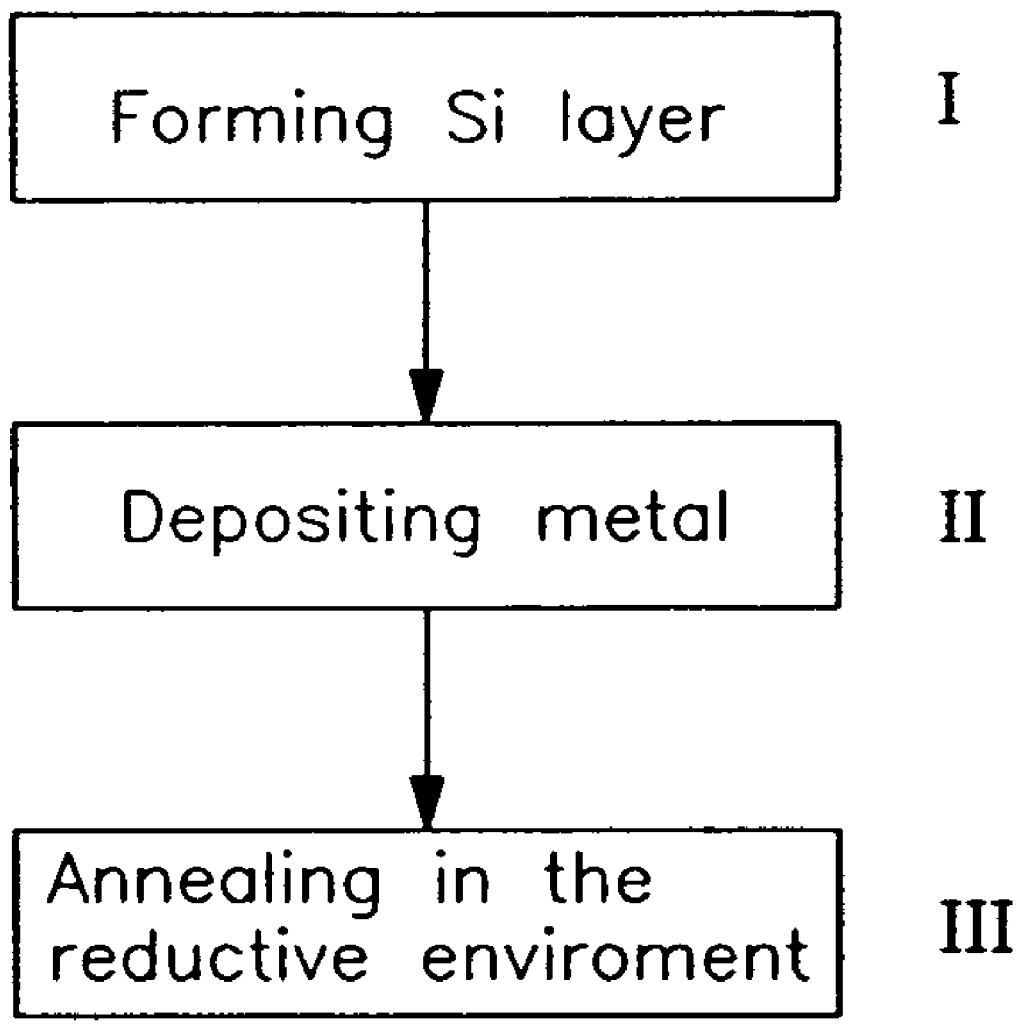
FIG. 1 is a block diagram demonstrating generally an embodiment of the present invention.

The present invention is directed at methods for transforming amorphous silicon into crystalline silicon by annealing amorphous silicon in the reductive environment, such as the Si containing environment. Combining the process of annealing with the utilization of the Si containing environment can increase the rate of crystallization by up to 300-400%, while requiring lower annealing temperatures. For example, the annealing temperature can be lowered from about 600° C. to about 450° C. for Ni, compared to the known methods of crystallization. Thus, the method of the present invention can make the process of forming the crystalline silicon more economical, and the improved quality of the final product can be expected.

Some terms used hereinafter are defined for the purposes of the present application as follows.

The term "crystalline silicon" is defined as the structure of solid silicon characterized by a periodic and repeating three-dimensional arrays of atoms of silicon forming a lattice with local crystalline structure similar to that of bulk silicon. The silicon lattice can be composed of different crystalline grains within which are characterized by a single crystal orientation. The different crystalline grains can be divided by grain boundaries yielding a polycrystalline solid film. The resulting polycrystalline solid film can have anisotropic properties, i.e., exhibiting different values of a given physical property in different crystallographic directions.

The term "substantially crystalline silicon" is defined as solid silicon comprising at least 90 mass % of crystalline silicon and the balance, amorphous silicon.

The term "amorphous silicon" is defined as the structure of solid silicon characterized by the absence of the long range order seen in a crystal lattice, and having isotropic properties, i.e., the same values of a property regardless of direction.

The terms "anneal" and "annealing" are defined as a heat treatment, wherein the microstructure and, consequently, the properties of a material are altered.

The term "reductive environment" is defined as the environment characterized by the presence of a reducing agent.

The term "reducing agent" is defined as a compound that causes another substance to undergo reduction. Reducing agents are electron donors and undergo oxidation in the oxidation-reduction process.

The term "Si containing environment" is defined as the environment characterized by the presence of a compound in the gaseous form, where the compound contains an atom of silicon (Si).

The term "nucleate" is defined as the transformation of amorphous silicon into silicon crystals around the particles of a metal.

The term "dope" or "doped" is defined as a very small amount (e.g., trace amount) of a compound added to modify the electronic or physical properties of crystalline silicon or to give it new properties.

The term "silicide" is defined as any compound of silicon with a more electropositive (electron accepting) element or radical. Such electropositive elements include some metals, such as copper or nickel. Accordingly, "metal silicide" is defined as any compound of silicon with a metal that is more electropositive than silicon.

The term "eutectic temperature" is defined as temperature in a binary system (i.e., a two-component mixture), in which a liquid solution co-exists with a pure solid of each component of the binary system, at a fixed pressure.

According to embodiments of the present invention, a method is provided for transforming amorphous silicon into crystalline silicon. In general, the method includes the steps schematically illustrated by the block diagram shown by FIG. 1. With reference to FIG. 1, a layer of amorphous silicon can be formed (I), followed by depositing a metal on the layer of amorphous silicon (II) to form a metal-silicon composite containing Si. The metal can form either a discontinuous or continuous layer on top of the silicon, or underneath the silicon, or within the silicon matrix. A reductive environment, such as Si containing environment, can be then formed, and the metal-silicon composite can be placed in that environment. The metal-silicon composite can be then annealed (III), forming crystalline silicon thereby.

The layer of amorphous silicon can be formed on a substrate, such as a glass substrate; alternatively, a free layer of amorphous silicon can be used, if desired. The layer of amorphous silicon can be formed on a glass substrate using a variety of methods known to those having ordinary skill in the art. For example, any of chemical vapor deposition, evaporation, pulsed laser deposition, molecular beam epitaxy, or magnetron sputtering can be used. If the chemical vapor deposition method is selected, those having ordinary skill in the art can choose between catalytic chemical vapor deposition, hot wire chemical vapor deposition, plasma enhanced chemical vapor deposition, or low pressure chemical vapor deposition, depending on the desired thickness and other properties of the amorphous silicon layer being formed. The thickness of the layer of amorphous silicon disposed on a glass substrate can be between about 100 nanometers and 500 nanometers, for example, about 250 nanometers.

The layer of amorphous silicon can be optionally doped, if desired. A variety of electronic dopants can be utilized for this purpose. Examples of the electronic dopants that can be used include boron, aluminum, gallium, indium, phosphorous, arsenic, antimony, or tellurium. Those having ordinary skill in the art can select a suitable method for introducing a dopant into the layer of amorphous silicon. The concentration of a dopant can be between about 0.1 and 1.0 atomic %, for example, with Gaussian distribution having a peak of about $10^{19}$ atoms of the dopant per cubic centimeter of amorphous silicon.

The layer of amorphous silicon formed as described above can be optionally de-oxidized to remove the native silicon oxides, such as an $SiO_2$ layer that is present over amorphous silicon. Various cleaning methods can be used, for example, cleaning the layer of amorphous silicon with a 5% aqueous solution of hydrofluoric acid (HF). The layer of amorphous silicon can be dipped into an HF solution, or alternatively spun-dried with an HF solution.

Following the process of de-oxidation, if used, a metal can be deposited over the layer of amorphous silicon to form a metal-silicon composite. The metals that can be used include metals having crystallization temperatures below 600° C. The metals to be used can include the metals having low eutectic temperatures with silicon, for example, gold, silver, aluminum, or indium. The metals forming silicides can be also used, for example, copper, nickel, or palladium.

Various methods can be used for the metal deposition. For example, methods shown by FIGS. 2-4 can be used. With reference to FIG. 3, the metal can be deposited using a spin-on process. In the spin-on process, a dispersion of a metal in a solvent can be first prepared. Isopropyl alcohol or acetone can be used as a solvent, and the concentration of the metal in the dispersion can be between about 20 μg/ml and 200 mg/ml. The dispersion can be then spun on over the layer of amorphous silicon at the speed of about 1,500 rpm for about 20 seconds. As a result, a metal-silicon composite can be formed on the glass substrate 1.

The metal-silicon composite includes the amorphous silicon layer 2 and metal particles 3. The metal particles 3 can be randomly distributed throughout the layer of amorphous silicon 2. The metal particles can be substantially spherical or can be irregularly shaped. The longest linear dimension of a metal particle 3 (e.g., a diameter for spherical particles) can be between about 2 and 200 nanometers. The concentration of the metal particles 3 can be about 1 particle per 100 square micrometers of the external surface of the layer 2.

Figure 2:
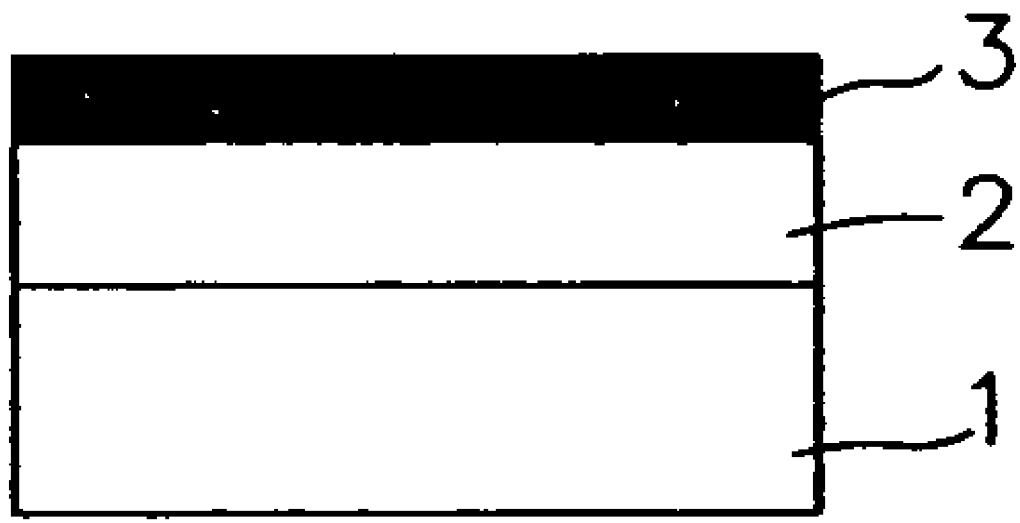
FIG. 2 shows schematically a metal-silicon composite according to an embodiment of the present invention.
Figure 3:
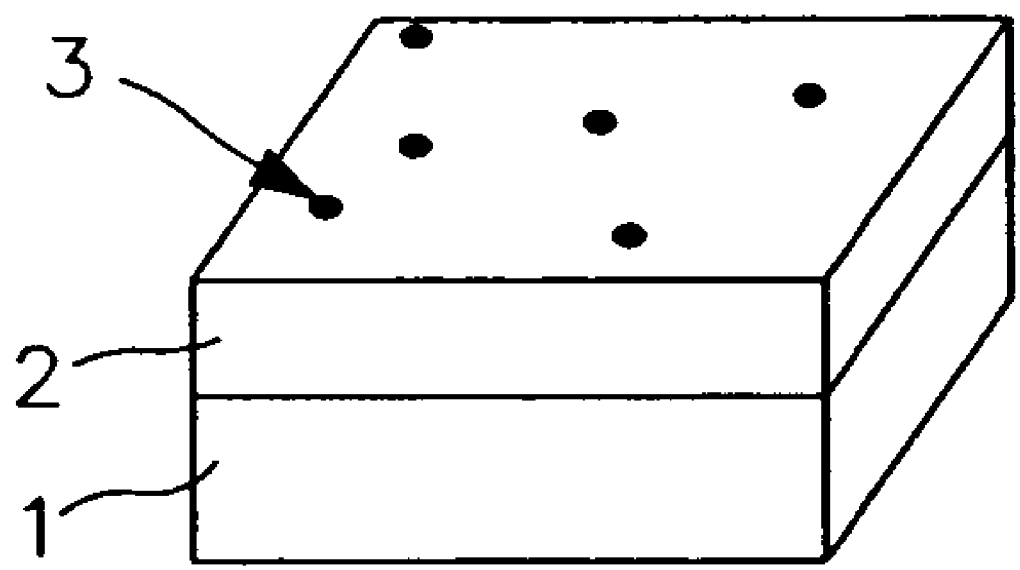
FIG. 3 shows schematically a metal-silicon composite according to an embodiment of the present invention.
Figure 4:
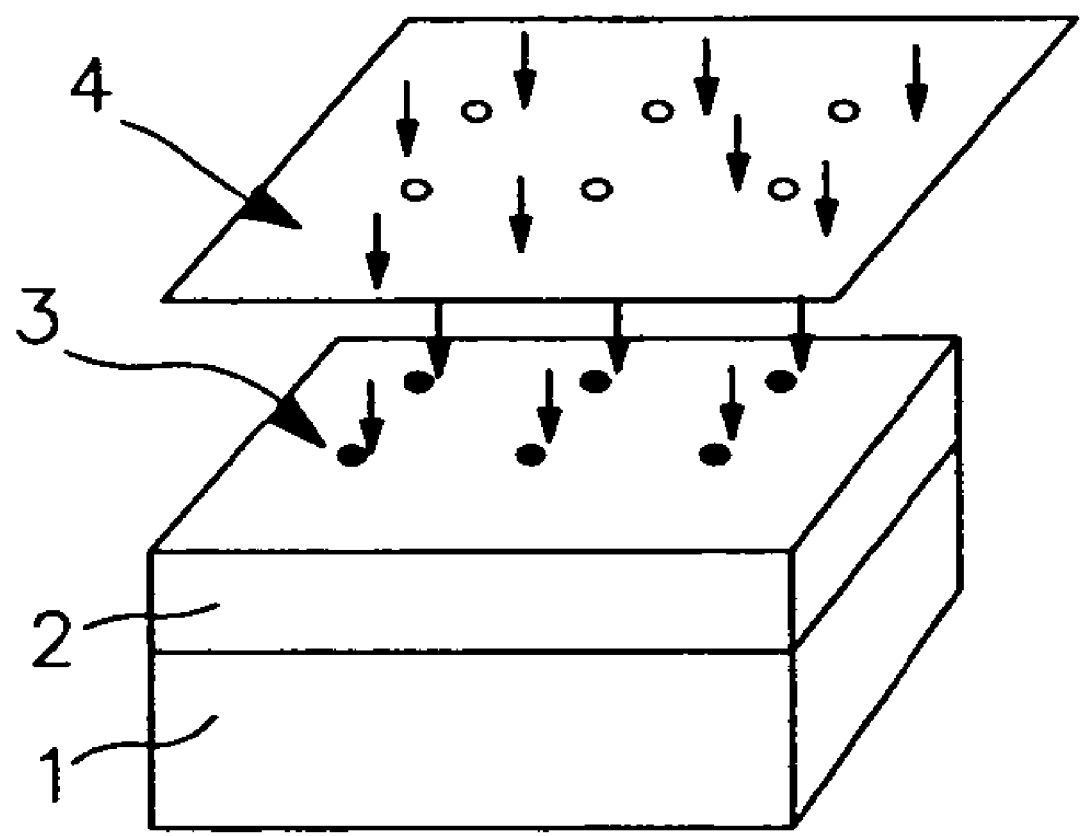
FIG. 4 shows schematically a metal-silicon composite according to an embodiment of the present invention.

With reference to FIG. 2, a metal layer 3 can be formed over the amorphous silicon layer 2 deposited on the glass substrate 1. The thickness of the metal layer 3 can be between about 5 and 10 nanometers, and it can be deposited using any suitable deposition method known to those having ordinary skill in the art, for example, metal vapor deposition, as described above. With reference to FIG. 4, the process of metal deposition can optionally incorporate standard lithographic techniques. In the lithographic process, a metal can be deposited over the amorphous silicon layer 2 using a mask 4. After the process of deposition is completed, the mask 4 is removed, leaving a metal-silicon composite comprising the amorphous silicon layer 2 and the metal particles 3 disposed over the amorphous silicon layer 2.

After the metal-silicon composite has been formed, as described above, the composite can be annealed to transform amorphous silicon to the crystalline form. The annealing temperature can be between about 150° C. and 600° C., for example, between about 320° C. and 600° C. for Ni, depending on the metal that is used in the metal-silicon composite. To illustrate, the lower annealing temperatures (e.g., 150-200° C.) can be used with aluminum-silicon composites, while the higher annealing temperatures (e.g., 350-600° C.) can be used with nickel-silicon composites. The duration of the annealing process can be between about 30 minutes and 6 hours, for example, about 3 hours.

The process of annealing can be conducted while the metal-silicon composite is situated in a reductive environment. Examples of reductive environment that can be used include a Si containing environment and the hydrogen gas environment. The Si containing environment can be created and maintained for the duration of the annealing process by surrounding the metal-silicon composite with a gaseous Si precursor. One way of forming the Si containing environment can include creating a flow of the gaseous precursor.

Examples of gaseous Si containing agents that can be employed include silane ($SiH_4$), silicon tetrachloride ($SiCl_4$), trichlorosilane, or dichlorosilane. Those having ordinary skill in the art can select other gaseous Si containing agents used, if desired. The gaseous Si containing environment can include solely a Si containing gaseous agent, or alternatively can include a blend of a Si containing gaseous agent and an inert gas (e.g., nitrogen or argon). If such a blend is to be used, the ratio between the Si containing gaseous agent and the inert gas in the blend can be determined by those having ordinary skill in the art.

When the metal-silicon composite described above is exposed to an elevated temperature in the Si containing environment, the process of nucleation of the amorphous silicon commences around the metal particles present in the composite. The crystal growth then propagates throughout the composite, for the duration of the exposure of the metal-silicon composite to the elevated temperature in the Si containing environment. As a result, substantially crystalline silicon (e.g., having more than 90% of silicon in the crystal form) can be formed on the substrate.

Figure 5:
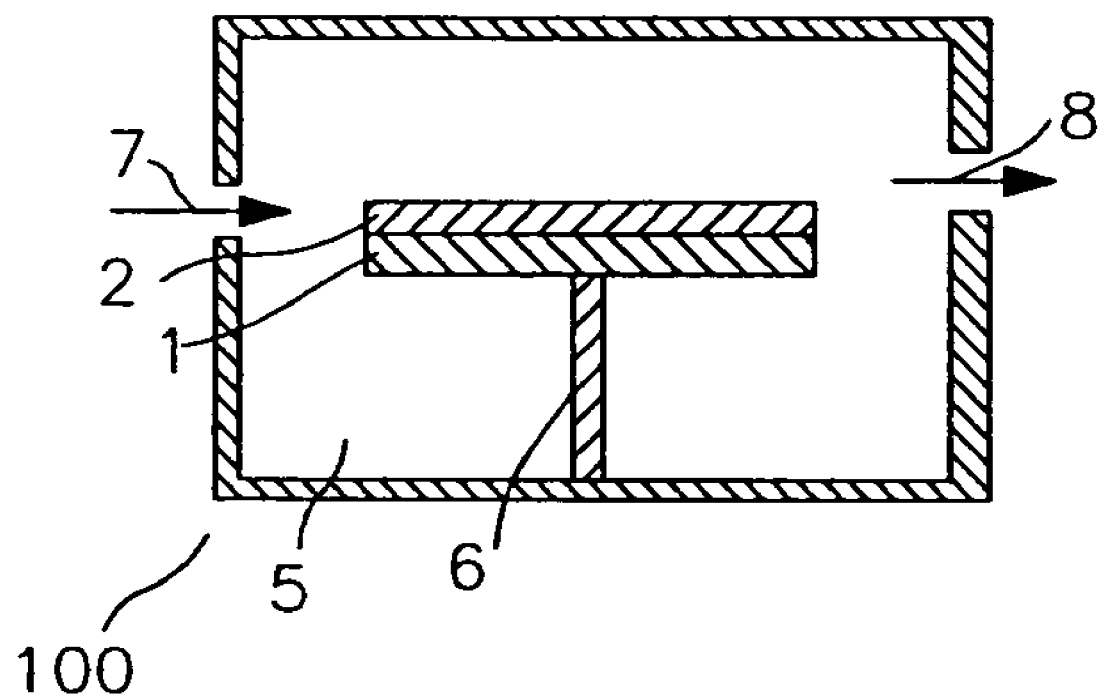
FIG. 5 shows schematically a method for forming crystalline silicon according to an embodiment of the present invention.

One exemplary embodiment of an apparatus that can be used for conducting the process of annealing is illustrated by FIG. 5. The apparatus 100 shown on FIG. 5 includes a chamber 5 having openings 7 and 8 for the ingress and egress of the gaseous Si containing agent, respectively. The substrate 1 having the metal-silicon composite 2 disposed on the substrate can be positioned on the holder 6. To conduct the process of annealing using the apparatus 100, the following procedure can be used.

The substrate 1 can be attached to the holder 6, and the chamber 5 can be evacuated. To evacuate the chamber 5, the ingress opening 7 can be temporarily hermetically closed (e.g., using a removable stopper) and a vacuum line (not shown) can be attached to the egress opening 8.

Alternatively, the location of the attachment of the vacuum line can be switched, i.e., the egress opening 8 can be hermetically closed and a vacuum line can be attached to the ingress opening 7. As another alternative, if desired, the vacuum line can be attached via neither the ingress opening 7 nor the egress opening 8. For example, a special opening (not shown) can be made in the wall of the chamber 5 for attaching the vacuum line. Using the vacuum line, the vacuum (e.g., between about $10^{-6}$ and $10^{-7}$ Torr) can be created inside the chamber 5.

Following the evacuating the chamber 5, the stopper that was temporarily used to close the ingress opening 7 can be removed and a flow of a Si containing gas or blend described above can be directed to the chamber 5. The Si containing gas or blend can enter the chamber 5 through the ingress opening 7 and exit through the egress opening 8, or vice versa. The flow rate of the Si containing gas or blend can be between about 1 and 5 standard cubic centimeters per minute (sccm), for example, about 2.5 sccm.

Next, the metal-silicon composite 2 can be heated up to a desired temperature described above. Various arrangements can be used for directing the heat to the metal-silicon composite. In one embodiment, the holder 6 can include an electric heating element (not shown) that can be used to heat the substrate 1 and the metal-silicon composite 2.

In another embodiment, an oven can be used as the chamber 5, with the heating elements embedded in the wall of the chamber. In yet another embodiment, the Si containing gas can be pre-heated to the desired temperature or to a temperature somewhat higher than the desired temperature (to allow for some heat loss), prior to the Si containing gas's entrance into the chamber 5.

The order of the steps of creating the Si containing environment and heating can be reversed, if desired. For example, the substrate 1 having the metal-silicon composite 2 thereon can be first heated, e.g., using the holder 6. When the temperature of the metal-silicon composite 2 has reached the desired level, the flow of the Si containing gas or blend can be directed to the chamber 5, as described above.

The temperature of the metal-silicon composite 2 can be regulated and/or maintained at a predetermined level. Standard temperature control and/or measurement techniques can be used. For example, a thermocouple or other similar device (not shown on FIG. 5) can be used for that purpose. The thermocouple can be placed into the chamber 5 or attached to the substrate 1.

After annealing the metal-silicon composite 2 for a predetermined period of time, the process of crystallization is over. The flow of the Si containing gas or blend is terminated and the composite, now containing substantially crystalline silicon can be cooled to the room temperature. The composite can then be optionally treated to remove the metal particles from crystalline silicon. The particles can be removed by etching the product using known techniques. For example, an acid or a base can be used for etching the Ni particles while the silicide will be inert and should not cause difficulty with it's lattice parameter 0.2% away from Si. Copper films or particles can be polished away.

The following examples are provided to further illustrate the advantages and features of the present invention, but are not intended to limit the scope of the invention.

EXAMPLE 1

Example 1 illustrates one embodiment of the method according to the present invention. Two samples of amorphous silicon deposited on the oxide coated Si substrate were prepared. The thickness of the amorphous silicon layer was about 100 nm and was deposited by MBE. The amorphous silicon layer was doped with ion implanted phosphorous; the concentration of phosphorous was about $10^{19}$ ions/$cm^3$.

The sample was dipped in a 5% solution of 48% HF in de-ionized water. Then a metal composition containing about 20 μg/ml of Ni particles in isopropyl alcohol was spun on at about 1,500 revolutions per minute (rpm) for about 20 seconds. The samples were annealed. The annealing temperature was about 485° C. for both samples. The first sample (test sample) was annealed in the silane gas environment at 2.5 standard cubic centimeter per minute (sccm) for about 3 hours and 35 minutes, and the second sample (control) was annealed in vacuum of about $10^{-7}$ torr for about 3 hours and 57 minutes. Following annealing, microphotographs were made for both samples.

Figure 6:
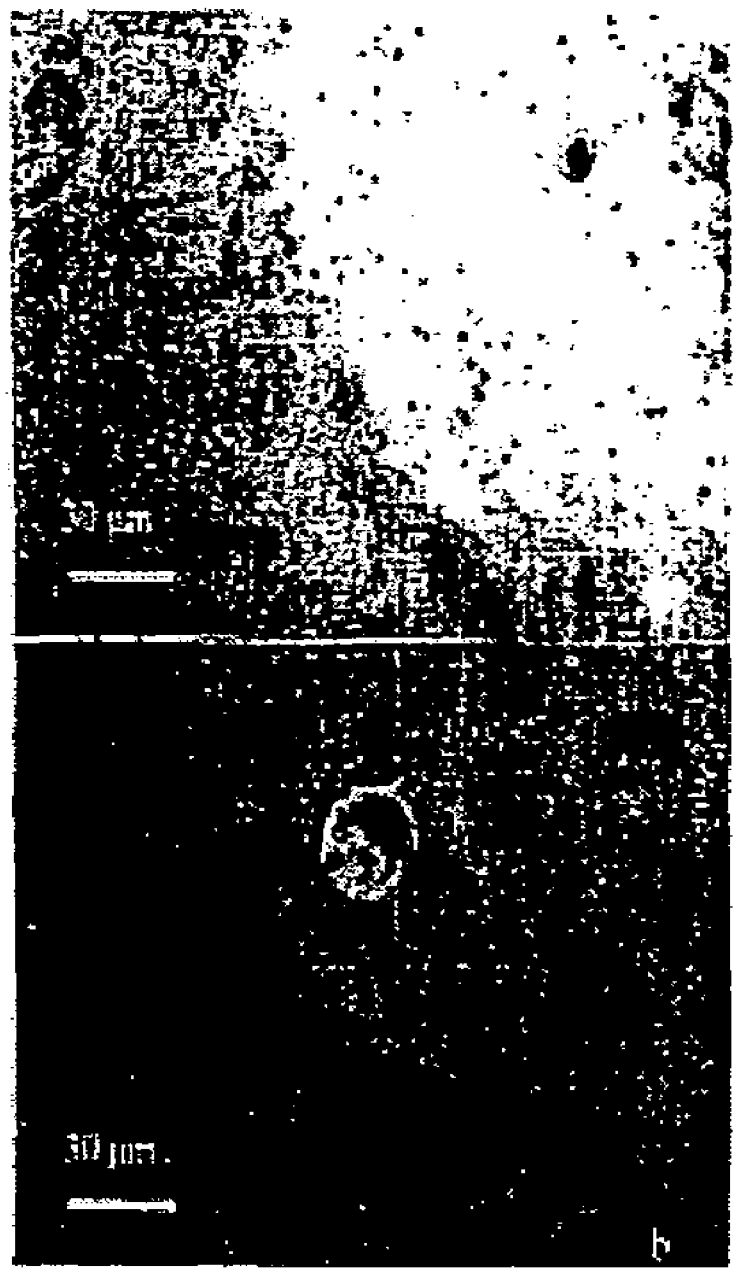
FIG. 6 shows microphotographs demonstrating the structure of crystalline silicon fabricated according to an embodiment of the present invention.

FIG. 6 shows the microphotographs for the sample annealed at about 485° C. in the silane environment for about 3 hours and 35 minutes (upper portion) and for the control sample (middle portion) annealed for about 3 hours and 57 minutes. As can be seen, the degree of crystallization was higher for the test sample. In fact it is almost 100% crystallized. Therefore, since the periods of annealing were similar and the annealing temperatures were identical for both samples, the presence of Si containing environment accelerated the process of crystallization.

EXAMPLE 2

Example 2 illustrates another embodiment of the method according to the present invention. Two samples of amorphous silicon deposited on the oxide coated Si substrate were prepared. The thickness of the amorphous silicon layer was about 200 nm and was deposited by MBE. The amorphous silicon layer was doped with ion implanted phosphorous; the concentration of phosphorous was about $10^{19}$ ions/cm$^3$.

The sample was dipped in a 5% solution of 48% HF in de-ionized water. Then a metal composition containing about 20 µg/ml of Ni particles in isopropyl alcohol was spun on at about 1,500 rpm for about 20 seconds. The samples were annealed. The annealing temperature was about 485° C. for both samples. The first sample (test sample) was annealed in the silane gas environment at about 2.5 sccm for about 6 hours and 43 minutes, and the second sample (control) was annealed in vacuum of about $10^{-7}$ torr for about 17 hours and 44 minutes.

Figure 7:
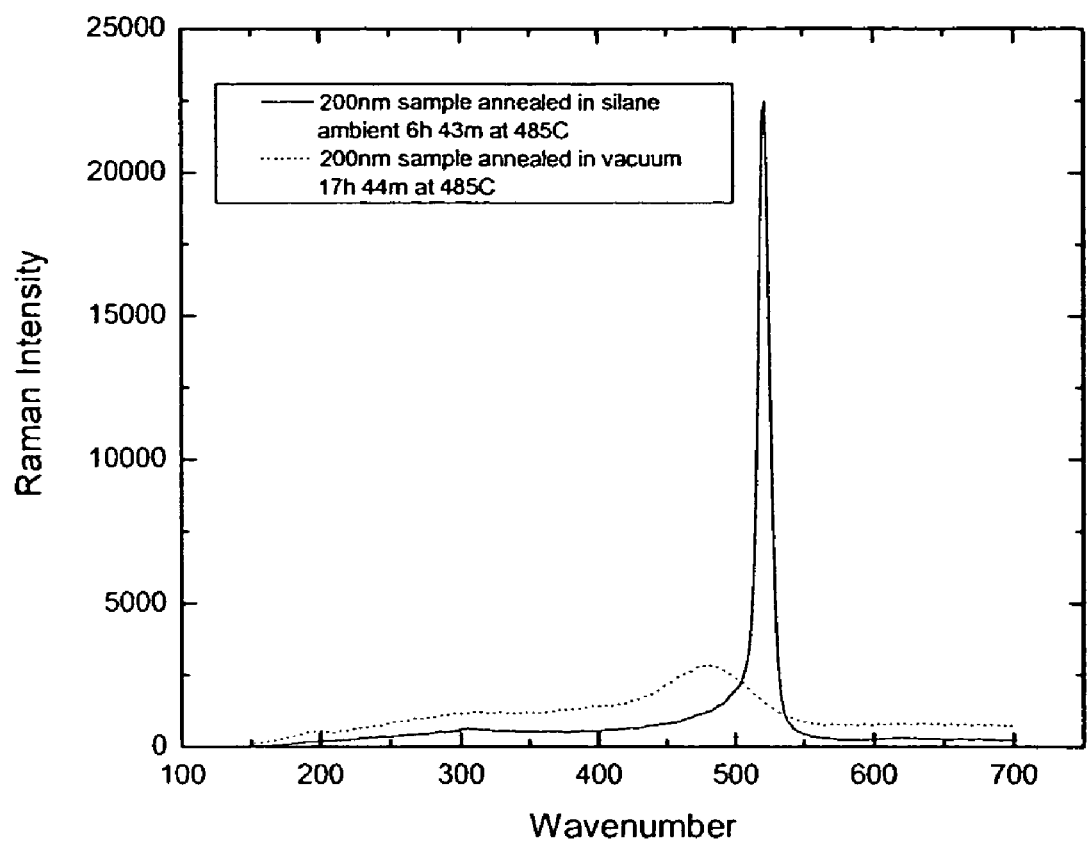
FIG. 7 shows the Raman spectra demonstrating another example of the crystalline silicon fabricated according to an embodiment of the present invention.

Following annealing, Raman spectroscopy was used to determine the crystallinity of both samples (FIG. 7). After about 6 hours and 43 minutes at about 485° C., the silane annealed film was about 100% crystalline, while the same film annealed in vacuum was about 100% amorphous. The peak at wavenumber 480 on the Raman spectra is indicative of amorphous Si, while the peak at 520 wavenumber is indicative of crystalline Si.

EXAMPLE 3

Example 3 illustrates another embodiment of the method according to the present invention. Two samples of amorphous silicon can be deposited on the glass substrate. The thickness of the amorphous silicon layer can be about 100 nm and can be deposited by MBE. The amorphous silicon layer can be doped with ion implanted phosphorous; the concentration of phosphorous can be about $10^{19}$ ions/cm$^3$.

The sample can be spun dry with a drop of HF in a 5% solution of 48% HF in de-ionized water. Then a metal composition containing about 20 µg/ml of Ni particles in isopropyl alcohol can be spun on at about 1,500 rpm for about 20 seconds. The samples can be annealed. The first sample (test sample) can be annealed in the silane gas environment at about 2.5 sccm for about 6 hours and 43 minutes at about 485° C., and the second sample (control) was annealed in vacuum of about $10^{-7}$ torr for about 17 hours at about 600° C.

Figure 8:
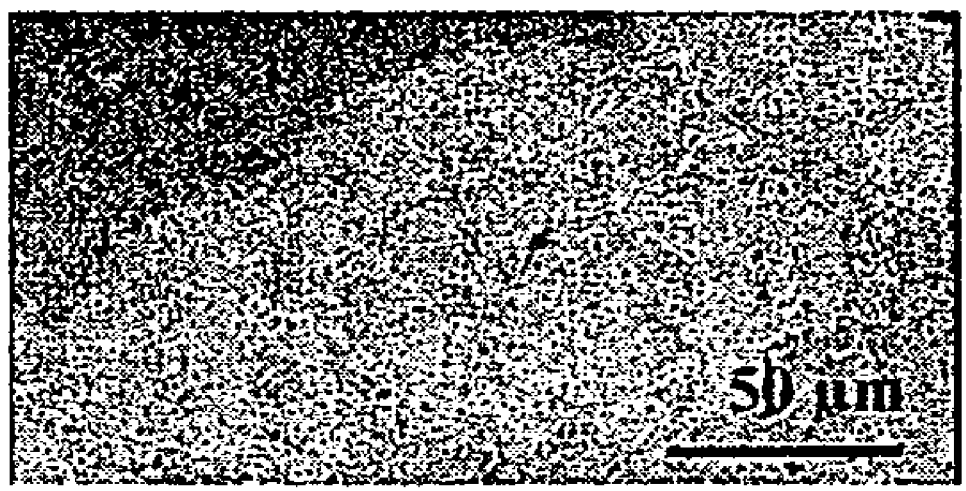
FIG. 8 shows a microphotograph demonstrating the structure of crystalline silicon fabricated according to the current technology with a glass substrate.

Following the anneal photomicrographs are taken as seen in the control sample in FIG. 8. This sample is only partially crystallized. The test sample would be more similar to FIG. 6 and be fully crystallized. Therefore, the silane environment can lower the annealing temperature and also can decrease the annealing time.

EXAMPLE 4

Example 4 illustrates one embodiment of the method according to the present invention. Two samples of amorphous silicon deposited on the oxide coated Si substrate were prepared. The thickness of the amorphous silicon layer was about 100 nm and was deposited by MBE. The amorphous silicon layer was doped with ion implanted phosphorous; the concentration of phosphorous was about $10^{19}$ ions/cm$^3$.

The sample was dipped in a 5% solution of 48% HF in de-ionized water. Then a metal composition containing about 20 µg/ml of Ni particles in isopropyl alcohol was spun on at about 1,500 rpm for about 20 seconds. The samples were annealed. The first sample (test sample) was annealed in the silane gas environment at about 2.5 sccm for about 3 hours and 35 minutes at about 485° C., and the second sample (control) was annealed in vacuum of about $10^{-7}$ torr for about 3 hours and 57 minutes. Following annealing, microphotographs were made for both samples.

Figure 9:
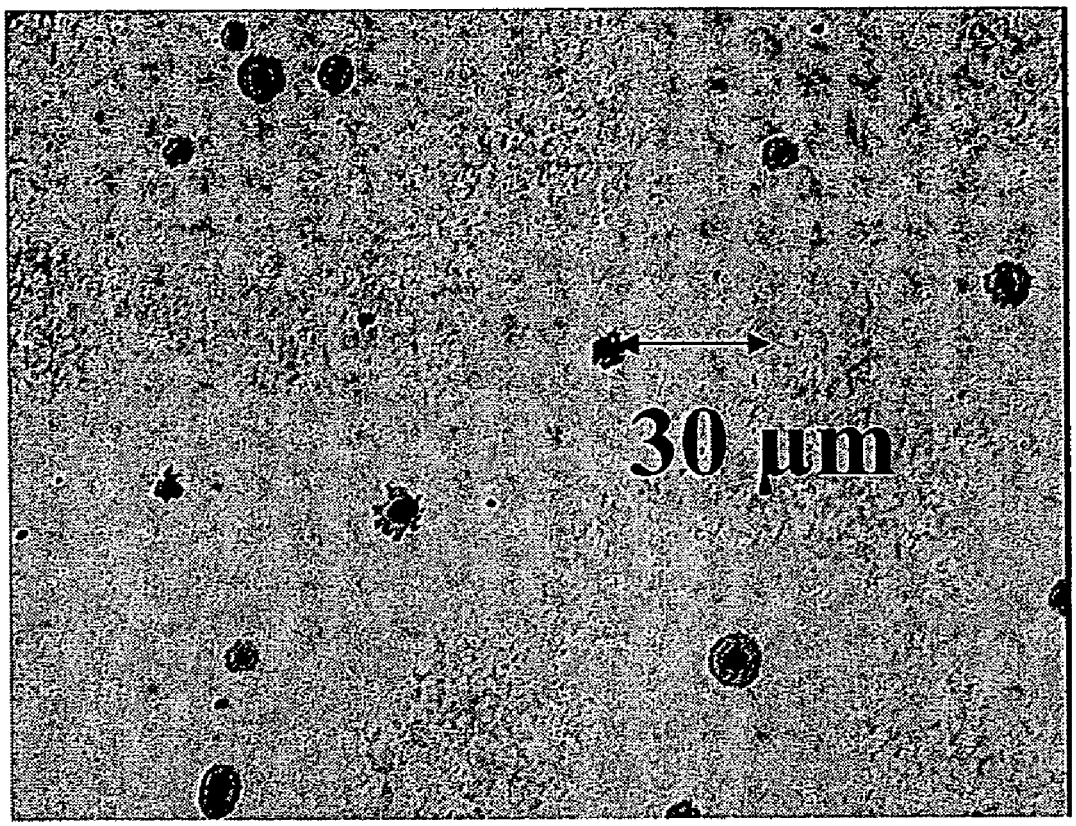
FIG. 9 shows a microphotograph demonstrating the structure of crystalline silicon fabricated according to the current technology with an oxide coated Si substrate.

FIG. 6 shows the microphotographs for the sample annealed at 485° C. in the silane environment for about 3 hours and 35 minutes (upper portion), and FIG. 9 shows the control sample annealed for about 10 hours at about 600° C. As can be seen, the degree of crystallization was higher for the test sample. This process reduces the crystallization time from about 17 hours to less than 4 hours, while lowering the process temperature.

Although the invention has been described with reference to the above examples, it will be understood that modifications and variations are encompassed within the spirit and scope of the invention. Accordingly, the invention is limited only by the following claims.

What is claimed is:

1. A device, comprising a silicon-metal composite disposed on a substrate, the silicon-metal composite having a silicon component and a metal component, wherein the silicon component comprises about 100% crystalline silicon, and wherein the composite is formed by annealing a composition, comprising amorphous silicon and a metal, in the presence of a reducing agent, with the further proviso that the silicon-metal composite is in a direct contact with the substrate to form a silicon/substrate interface, wherein the amorphous silicon/metal composition comprises a continuous layer of a metal disposed over a layer of amorphous silicon, and wherein the concentration of the metal in the silicon-metal composite is about 1 particle per 100 µm$^2$ of the external surface of the layer of amorphous silicon.

2. The device of claim 1, wherein amorphous silicon is free of silicon oxides.

3. The device of claim 1, wherein the substrate comprises glass.

4. The device of claim 3, wherein the layer of amorphous silicon has the thickness between about 100 nanometers and 500 nanometers.

5. The device of claim 1, wherein the metal is selected from a group consisting of gold, silver, aluminum, indium, copper, nickel and palladium.

6. The device of claim 1, wherein the thickness of the metal layer is between about 5 nm and 10 nm.

7. The device of claim 1, wherein the composition additionally includes a dopant incorporated into amorphous silicon.

8. The device of claim 7, wherein the dopant is selected from a group consisting of elemental boron, aluminum, gallium, indium, phosphorous, arsenic, antimony, and tellurium.

9. The device of claim 7, wherein the concentration of the dopant in amorphous silicon is between about 0.1 and 1.0 atomic per cent.

10. The device of claim 1, wherein the reducing agent is a gaseous substance forming a blanket around the metal-silicon composition.

11. The device of claim 10, wherein the reducing agent is selected from a group consisting of silane, silicon tetrachloride, trichlorosilane, dichlorosilane, and hydrogen.

12. A device, comprising a silicon-metal composite disposed on a substrate, the silicon-metal composite having a crystalline silicon component and a metal component, wherein the composite is formed by annealing a composition, comprising amorphous silicon and a metal, in the presence of a reducing agent, with the further proviso that amorphous silicon is free of silicon oxides, wherein the silicon-metal composite is in a direct contact with the substrate to form a silicon/substrate interface, wherein the amorphous silicon/metal composition comprises a continuous layer of a metal disposed over a layer of amorphous silicon, and wherein the concentration of the metal in the silicon-metal composite is about 1 particle per 100 $\mu m^2$ of the external surface of the layer of amorphous silicon.

13. The device of claim 12, wherein the substrate comprises glass.

14. The device of claim 13, wherein amorphous silicon is deposited as a layer having the thickness between about 100 nanometers and 500 nanometers.

15. The device of claim 12, wherein the metal is selected from a group consisting of gold, silver, aluminum, indium, copper, nickel and palladium.

16. The device of claim 12, wherein the thickness of the metal layer is between about 5 nm and 10 nm.

17. The device of claim 13, wherein the composition additionally includes a dopant incorporated into amorphous silicon.

18. The device of claim 17, wherein the dopant is selected from a group consisting of elemental boron, aluminum, gallium, indium, phosphorous, arsenic, antimony, and tellurium.

19. The device of claim 17, wherein the concentration of the dopant in amorphous silicon is between about 0.1 and 1.0 atomic per cent.

20. The device of claim 12, wherein the reducing agent is a gaseous substance forming a blanket around the metal-silicon composition.

21. The device of claim 20, wherein the reducing agent is selected from a group consisting of silane, silicon tetrachloride, trichlorosilane, dichiorosilane, and hydrogen.

22. A device, comprising a silicon-metal composite disposed on a substrate, the silicon-metal composite having a silicon component and a metal component, wherein the silicon component comprises about 100% crystalline silicon, and wherein the composite is formed by annealing a composition, comprising amorphous silicon and a metal, in the presence of a gaseous reducing agent forming a blanket around the metal-silicon composition, with the further proviso that the metal component in the silicon-metal composition is present in a form of discreet metal particles distributed throughout a layer of amorphous silicon, with the further proviso that the silicon-metal composite is in a direct contact with the substrate to form a silicon/substrate interface, wherein amorphous silicon is deposited as a layer having the thickness between about 100 nanometers and 500 nanometers and wherein the amorphous silicon/metal composition comprises a continuous layer of a metal disposed over the layer of amorphous silicon.

23. The device of claim 22, wherein amorphous silicon is free of silicon oxides.

24. The device of claim 22, wherein the substrate comprises glass.

25. The device of claim 22, wherein the metal is selected from a group consisting of gold, silver, aluminum, indium, copper, nickel and palladium.

26. The device of claim 22, wherein the concentration of the metal in the composition is about 1 particle per 100 $\mu m^2$ of the external surface of the layer of amorphous silicon.

27. The device of claim 22, wherein the composition additionally includes a dopant incorporated into amorphous silicon.

28. The device of claim 27, wherein the dopant is selected from a group consisting of elemental boron, aluminum, gallium, indium, phosphorous, arsenic, antimony, and tellurium.

29. The device of claim 27, wherein the concentration of the dopant in amorphous silicon is between about 0.1 and 1.0 atomic per cent.

30. The device of claim 22, wherein the reducing agent is selected from a group consisting of silane, silicon tetrachioride, trichlorosilane, dichlorosilane, and hydrogen.

* * * * *